United States Patent [19]

Yamaguchi et al.

[11] Patent Number: 4,952,480

[45] Date of Patent: Aug. 28, 1990

[54] PHOTOPOLYMERIZABLE COMPOSITION

[75] Inventors: Jun Yamaguchi; Fumiaki Shinozaki, both of Shizuoka; Masaki Okazaki; Keiichi Adachi, both of Kanagawa, all of Japan

[73] Assignee: Fuji Photo Film Co., Ltd., Kanagawa, Japan

[21] Appl. No.: 252,466

[22] Filed: Oct. 3, 1988

[30] Foreign Application Priority Data

Oct. 1, 1987 [JP] Japan ................................ 62-248747

[51] Int. Cl.$^5$ ............................................. G03F 7/027
[52] U.S. Cl. .................................... 430/281; 430/914; 430/915; 522/31; 522/63
[58] Field of Search ............... 430/914, 281, 915, 138; 522/31, 63

[56] References Cited

U.S. PATENT DOCUMENTS

| | | | |
|---|---|---|---|
| 4,307,182 | 12/1981 | Dalzell et al. | 430/339 |
| 4,343,891 | 8/1982 | Aasen et al. | 430/337 |
| 4,447,521 | 5/1984 | Tiers et al. | 430/337 |
| 4,562,137 | 12/1985 | Sanders | 430/138 |
| 4,772,541 | 9/1988 | Gottschalk et al. | 430/339 |
| 4,788,124 | 11/1988 | Wright | 430/138 |
| 4,800,149 | 1/1989 | Gottschalk et al. | 430/138 |
| 4,839,274 | 6/1989 | Logan | 430/281 |
| 4,874,684 | 10/1989 | Yamamoto | 430/138 |

*Primary Examiner*—Paul R. Michl
*Assistant Examiner*—Christopher D. RoDee
*Attorney, Agent, or Firm*—Sughrue, Mion, Zinn, Macpeak & Seas

[57] ABSTRACT

Photopolymerization initiator compositions having high photosensitivity to light sources giving visible rays and the other rays in the longer wavelengths. The compositions containing polymerizable compounds having at least one ethylenic unsaturated bond and organic boron compound anionic salts of indolenine dye compounds having at least one electron-attracting group in the nuclei can be used for the production of planographic plates, resin letterpress printing plates and photoresists or photomasks for printed circuit substrates. The polymerizable compounds having at least one ethylenic unsaturated bond can be encapsulated to obtain microcapsules to be used for the formation of black and white or color images.

9 Claims, No Drawings

PHOTOPOLYMERIZABLE COMPOSITION

FIELD OF THE INVENTION

The present invention relates to a photo-polymerizable composition containing a new photo-polymerization initiator. More particularly, the present invention relates to high-sensitivity spectrally-sensitized photopolymerizable compositions which can be utilized for planography, resin letterpress printing, photoresists or photomasks for producing printed circuit substrates, black and white or color transfer sheets and processes for the production thereof.

BACKGROUND OF THE INVENTION

A photopolymerizable composition contains principally a photopolymerization initiator and an addition-polymerizable compound having two or more ethylenic unsaturated bonds in a molecule (which is hereinafter called "a polyfunctional monomer"), which is hardened by the irradiation of light to cause a change of tackiness and solubility in a solvent. These properties are widely used for photography, printing, metal surface processing, ink and so on. The idea and the application thereof are widely documented, and are described, for example, in J. Kosar, *Light Sensitive Systems*, J. Wiley & Sons, New York, 1965, pp. 158-193; and K. I. Jacobson and R. E. Jacobson, *Imaging Systems*, J. Wiley & Sons, New York, 1976, pp. 181-222.

Also, as methods of forming images by utilizing photopolymerizable compositions, image-forming systems utilizing photosensitive microcapsules, including systems wherein the photopolymerizable compositions are contained in capsules have been proposed. For example, JP-A-57-124343, JP-A-57-179836, and JP-A-57-197538 (the term "JP-A" as used herein means an "unexamined published Japanese patent application") disclose a method of forming dye-images comprising image-wise exposing to light a color sheet coated with microcapsules containing a dye and a photopolymerizable composition comprising a vinyl compound and a photopolymerization initiator, and placing the exposed color sheet against an image receiving sheet and applying pressure on the two sheets over the whole surface thereof to rupture the microcapsules and release dye for transfer.

Recently, attempts have been made to use these photopolymerizable compositions spectrally sensitized to the region of visible rays for the formation of digital images using a laser as a light source, and for application to full-color photosensitive materials.

For example, *Nippon Shashin Gakkai-shi*, Vol. 49, No. 3, p. 230 (1986) and *Kinoh Zairyo* (which means "Functional Materials"), September 1983, pp. 48-60 disclose a method of the spectral sensitization of photopolymerizable compositions to be used for laser-recording. Also, JP-A-59-189340 discloses a method of using organic dyes for the spectral sensitization of organic peroxide initiators. EP-A1-223587 discloses organic boron anionic salts of organic cationic dyes to be used as novel photopolymerization initiators.

Particularly, the method of using the organic boron compound anionic salts of organic cationic dye compounds as photosensitive initiators is very useful in view of the possibility of preparing photopolymerizable compositions sensitive to light in any wavelength because of the wide range of choice of cationic dye compounds.

Certainly, photopolymerizable compositions having sensitivity to visible rays could be produced by these methods, but it has been found that the resulting photosensitivity thereof was not satisfactory.

SUMMARY OF THE INVENTION

One object of the present invention is to provide novel photopolymerizable compositions having high photosensitivity to light sources of visible rays and other rays in the longer wavelengths. More particularly, the present invention is to provide highly-sensitive photopolymerizable compositions using new organic boron compound anionic salts of organic cationic dyes as a photopolymerization initiator and having photosensitivity to light sources of visible rays and other rays in the longer wavelengths such as those emitted by a laser source, which compositions can advantageously be used for the production of lithographic printing plates, resin letterpress printing plates and photoresists or photomasks for printed circuit substrates.

Another object of the present invention is to provide microencapsulated photopolymerizable compositions having high photosensitivity to visible light rays and other rays in the longer wavelengths, which compositions can advantageously be used for the formation of black and white or color images.

The inventors have engaged in extensive studies to discover that the above objects can be attained by using a photopolymerizable composition which comprises (a) a polymerizable compound having at least one ethylenic unsaturated bond, and (b) a salt formed by an organic cationic dye compound and an organic boron compound anion, wherein the salt is represented by the following formula (I), with the organic cationic dye compound (De) being represented by the following formula (II):

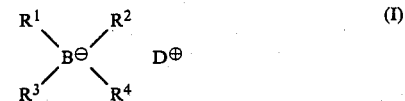

wherein $D^{\oplus}$ represents a cationic dye represented by formula (II), $R^1$, $R^2$, $R^3$, and $R^4$, which may be the same or different, each represents an alkyl group, an aryl group, an aralkyl group, an alkaryl group, an alkenyl group, an alkinyl group, an alicyclic group, a heterocyclic group, an allyl group, and a derivative thereof, and two or more of $R^1$, $R^2$, $R^3$, and $R^4$ may combine with each other to form a cyclic structure;

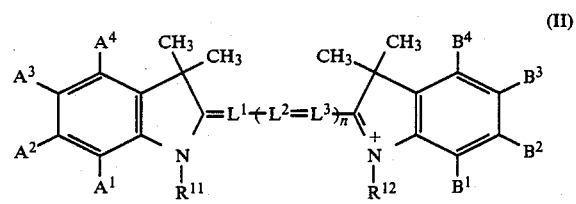

wherein $R^{11}$ and $R^{12}$ each represents an alkyl group, $L^1$, $L^2$, and $L^3$ each represents a methine group, n represents an integer of 0 to 4, and $A^1$, $A^2$, $A^3$, $A^4$, $B^1$, $B^2$, $B^3$ and $B^4$, which may be the same or different, each represents a hydrogen atom or an electron-attracting group (Hammett's substituent constant $\sigma > 0$), with the proviso that at least one of the $A^1$, $A^2$, $A^3$, $A^4$, $B^1$, $B^2$, $B^3$ and $B^4$ represents an electron-acting group.

DETAILED DESCRIPTION OF THE INVENTION

As the alkyl groups represented by $R^{11}$ and $R^{12}$, there are mentioned, for example, alkyl groups of 1–18 carbon atoms (such as an unsubstituted alkyl group (e.g., methyl, ethyl, propyl, isopropyl, butyl, isobutyl, hexyl, octyl, dodecyl, octadecyl), a substituted alkyl group such as an aralkyl group (e.g., benzyl, 2-phenylethyl), a hydroxyalkyl group (e.g., 2-hydroxyethyl, 3-hydroxyethyl), a carboxyalkyl group (e.g., 2-carboxyethyl, 3-carboxypropyl, 4-carboxybutyl, carboxymethyl), an alkoxyalkyl group (e.g., 2-methoxyethyl, 2-(2-methoxyethoxy)ethyl), a sulfoalkyl group (e.g., 2-sulfoethyl, 3-sulfopropyl, 3-sulfobutyl, 4-sulfobutyl, 2-(3-sulfopropoxy)ethyl, 2-hydroxy-3-sulfopropyl, 3-sulfopropoxyethoxyethyl), a sulfatoalkyl group (e.g., 3-sulfatopropyl, 4-sulfatobutyl), a heterocyclic substituted alkyl group (e.g., 2-(pyrrolidine-2-one-1-yl)ethyl, tetrahydrofurfuryl), 2-acetoxyethyl, carbomethoxymethyl, 2-methanesulfonylaminoethyl, allyl).

The methine group represented by $L^1$, $L^2$, or $L^3$ may be substituted with a substituent such as an alkyl group (e.g., methyl, ethyl), an aryl group (e.g., phenyl), an aralkyl group (e.g., benzyl), a halogen atom (e.g., chlorine, bromine), or an alkoxy group (e.g., methoxy, ethoxy), and two or more of the methine chain substituents may combine with each other to form a 4–6 membered ring.

Also $R^{11}$ or $R^{12}$ may form a 4–6 membered ring by joining together with $L^1$, $L^2$, or $L^3$.

Examples of the electron-attracting groups represented by $A^1$, $A^2$, $A^3$, $A^4$, $B^1$, $B^2$, $B^3$, and $B^4$ include a halogen atom (fluorine, chlorine., bromine, iodine), a nitro group, a crabamoyl group (e.g., carbamoyl, N-ethylcarbamoyl, N-propylcarbamoyl, N-hexylcarbamoyl), an alkoxycarbonyl group (e.g., methoxycarbonyl, ethoxycarbonyl, 2-ethylhexyloxycarbonyl, octyloxycarbonyl), a sulfamoyl group (e.g., sulfamoyl, N-butylsulfamoyl) and a cyano group.

The organic cationic dye compound represented by formula (II) can be synthesized by, for example, U.S. Pat. Nos. 3,723,116 and 3,501,311, etc.

The organic boron compound anion in general formula (I) include those disclosed in U.S. Pat. Nos. 3,567,453, 4,307,182, 4,343,891, 4,447,521, 4,450,227, JP-A Nos. 62-150242, and 62-143044. The most preferable organic boron compound anions for formula (I) are those wherein $R^1$, $R^2$ and $R^3$ are the same as one another, each being selected from phenyl, p-methoxyphenyl, p-butoxyphenyl, p-dimethylaminophenyl and p-chlorophenyl, and $R^4$ is selected from methyl, ethyl, propyl, butyl, n-hexyl and n-heptyl.

As the compounds of formula (I), there may be used any organic boron compound anionic salts of organic cationic dyes synthesized by reference to the above-mentioned patents. The compounds of formula (I) may also be prepared by adding any salt of an organic cationic dye, e.g., a chloride salt or an iodide salt, and any salt of an organic boron compound, e.g., the tetrabutyl ammonium salt, to a photopolymerizable composition.

The following examples of the organic boron compound anionic salts of organic cationic dye compounds, but it should be understood that the scope of the present invention is not limited thereto.

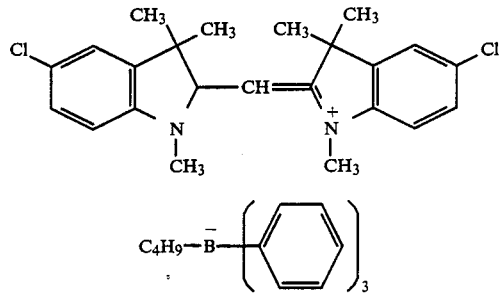

1.

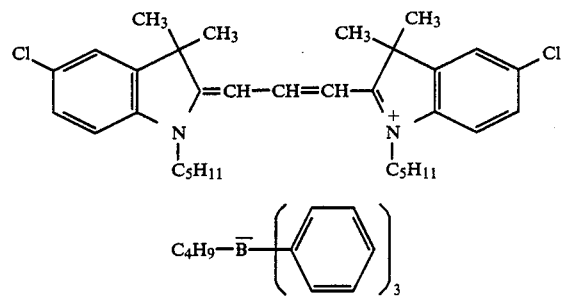

2.

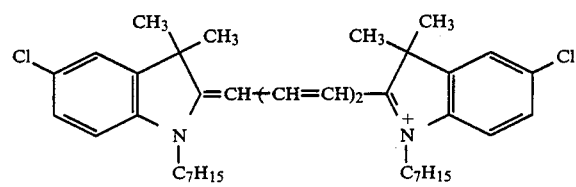

3.

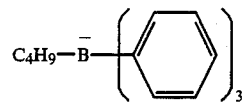
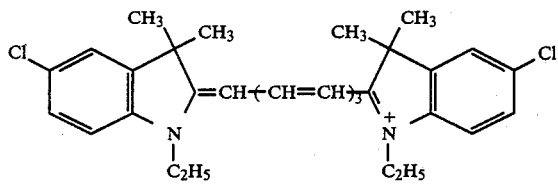
4.
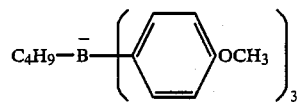
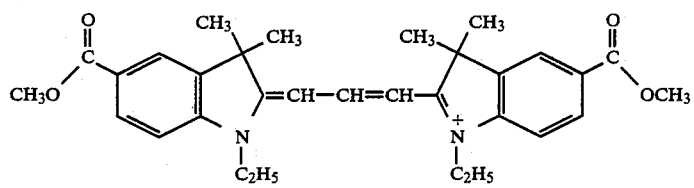
5.
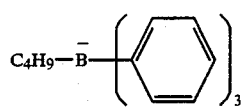
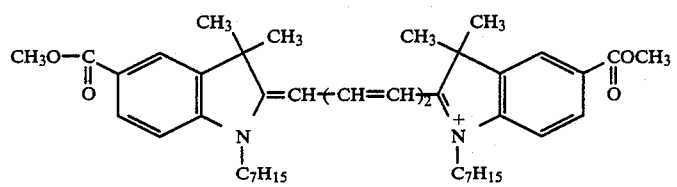
6.
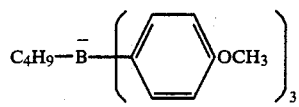
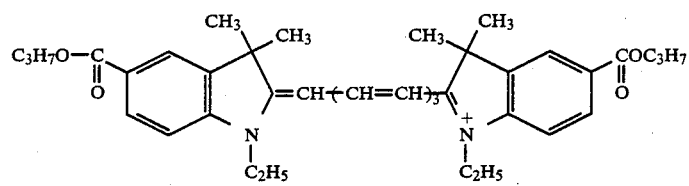
7.
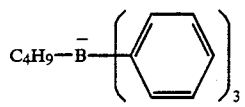
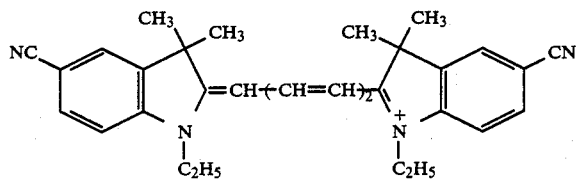
8.
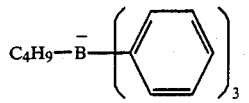

-continued
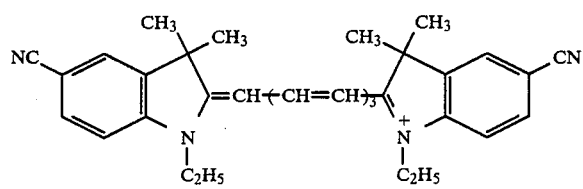
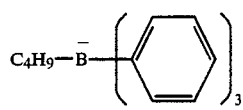
9.
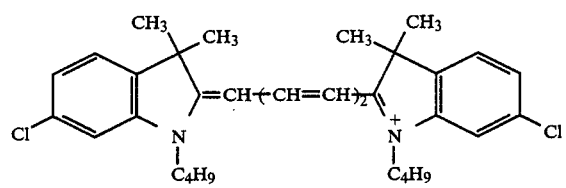
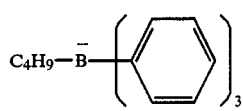
10.
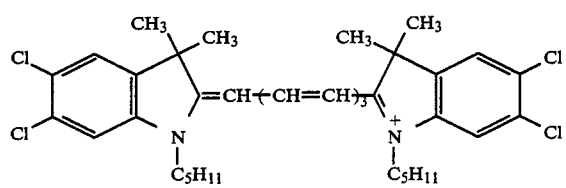
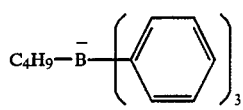
11.
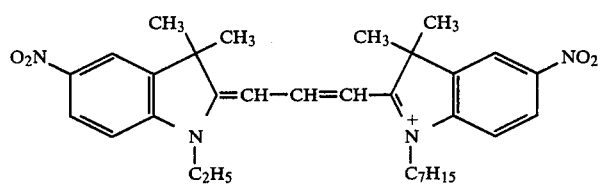
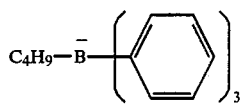
12.
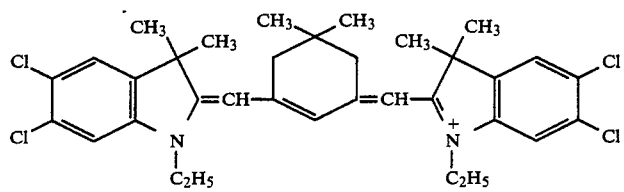
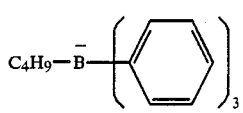
13.

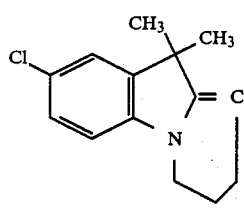
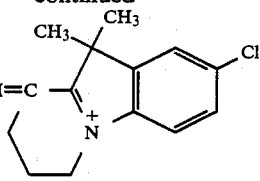

14.

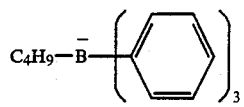

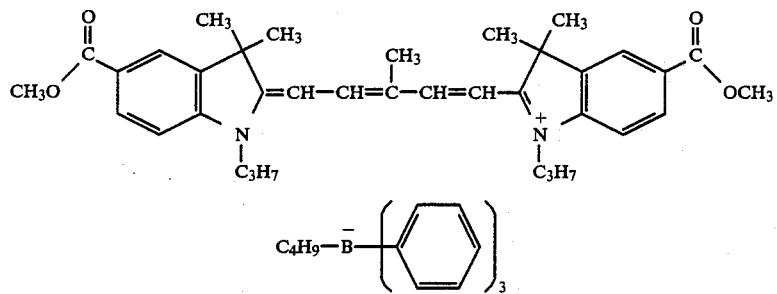

15.

The polymerizable compound having at least one ethylenic unsaturated bond, which is an essential constituent of the composition of the present invention, is intended to include, such as a monomer, a prepolymer such as a dimer, a trimer or another oligomer, a mixture thereof, a copolymer, or the like. As examples of such a polymerizable compound, mention may be made of unsaturated carboxylic acids, their salts, their esters of aliphatic polyhydric alcohols, their amides of aliphatic polyamine compounds, and so on.

Specific examples of unsaturated carboxylic acids include acrylic acid, methacrylic acid, itaconic acid, crotonic acid, isocrotonic acid, maleic acid, and so on.

Specific examples of salts of unsaturated carboxylic acids include sodium salts and potassium salts of the foregoing acids.

Specific examples of esters of aliphatic polyhydric alcohol compounds and unsaturated carboxylic acids include acrylic acid esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, 1,4-cyclohexane-diol diacrylate, tetraethylene glycol diacrylate, pentaerythriutol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetra-acrylate, sorbitol pentaacrylate, sorbitol hexaacrylate, polyester acrylate oligomers, etc.; methacrylic acid esters such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pantaerythritol trimetharylate, dipentaerythritol dimethacrylate, sorbitol trimethacrylate, sorbitol tetramethacrylate, bis-[p-(3-methacryloxy-2-hydroxypropoxy)phenyl]dimethylmethane, bis-[p-(acryloxyethoxy)phenyl]dimethylmethane, etc.; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotonic acid esters such as ethylene glycol dicrotonate, tetramethylene glycol dicrotonate, pentaerythritol dicrotonate, sorbitol tetracrotonate, etc.; isocrotonic acid esters such as ethylene glycol diisocrotonate, pentaerythritol diisocrotonate, sorbitol tetraisocrotonate, etc.; and maleic acid esters such as ethylene glycol dimaleate, triethylene glycol dimaleate, pentaerythritol dimaleate, sorbitol tetramaleate, etc. In addition, mixtures of two or more of the above-cited esters can be used.

Specific examples of amides of aliphatic polyamines and unsaturated carboxylic acids include methylenebisacrylamide, methylenebis-methacrylamide, 1,6-hexamethylenebis-acrylamide, 1,6-hexamethylenebismethacrylamide, diethylenetriamine trisacrylamide, xylylenebisacrylamide, xylylenebismethacrylamide, and the like.

As other examples of the polymerizable compounds, mention may be made of vinylurethane compounds which have two or more of polymerizable vinyl groups in a molecule and are prepared by addition of hydroxyl group-containing vinyl monomers represented by the following formula (III) to polyisocyanate compounds containing two or more of isocyanate groups in a molecule, as described in JP-B-48-41708 (The term "JP-B" as used herein means an "examined Japanese patent publication"):

$$CH_2=C(R^{21})COOCH_2CH(R^{22})OH \quad (III)$$

wherein $R^{21}$ and $R^{22}$, which may be the same or different, each represents H or $CH_3$.

Also, high molecular weight compounds containing vinyl or vinylidene groups, e.g., condensates of high molecular weight compounds containing hydroxyl groups, amino groups, epoxy groups, halogen atoms or sulfonyloxy groups in their side chains and acrylic acid, methacrylic acid or derivatives thereof, can be used in the present invention.

Further, color image-forming substances, e.g., compounds prepared by introducing one or more of a vinyl group into a dye or leuco dye molecule, can be utilized as the polymerizable compound.

It is desirable that the salt formed by an organic boron compound anion and an organic cationic dye compound be added in a proportion of from about 0.01 to about 50 wt % to the polymerizable compound.

Novel photopolymerizable compositions comprising such ethylenic unsaturated bond-containing polymerizable compounds and salts formed by an organic boron compound anion and an organic cationic dye compound as exemplified above can be used in various ways.

For instance, the photopolymerizable compositions coated on supports together with binder polymers can be applied to resist materials for making printing plates and printed circuit substrates by reference to U.S. Pat. Nos. 4,604,342, 4,587,199, 4,629,680, 4,415,652, 4,431,723 and 4,550,073, JP-A Nos. 61-285444, 61-213213 and so on, to color proof materials by reference to JP-A No. 62-67529, U.S. Pat. No. 4,604,340, and so on, and to many fields according to known methods.

Moreover, the photopolymerizable composition of the present invention can be used to greater advantage in producing image-forming systems utilizing microcapsules, because it has high sensitivity even in the visible region. The photopolymerizable composition of the present invention can be applied to multi-color image forming systems by reference to U.S. Pat. No. 4,576,891, etc.

In applying the present composition to image-forming systems utilizing microcapsules, JP-A-57-197538, U.S. Pat. Nos. 4,587,194, 4,399,209, and 4,440,846, EP-A1-223587 and so on can be referred to. The image formation in such systems can be effected, e.g., according to a process which comprises forming a light-sensitive sheet by coating on a support microcapsules enclosing a dye precursor and a photopolymerizable composition comprising an ethylenic vinyl compound and a photopolymerization initiator, subjecting the light-sensitive sheet to imagewise exposure to harden the exposed microcapsules, and applying pressure to the whole surface of the lightsensitive sheet superposed on a color developer sheet, thereby rupturing the unexposed microcapsules and transferring the color image-forming substance (e.g., a dye precursor) into an image-receiving element (e.g., a color developer layer) to achieve color development.

Now, the present invention is illustrated citing the image-forming systems utilizing microcapsules as an example.

To the photopolymerizable composition of the present invention, various kinds of additives can be added depending on the intended use. For example, a thermal polymerization inhibitor, a polymerization accelerator, image-forming substances (dyes, dye precursors, or pigments) and so on can be added.

Methods of producing light-sensitive materials utilizing the photopolymerizable composition of the present invention are described below.

Various methods can be employed for the production of the light-sensitive materials, and a general method comprises the steps of preparing coating compositions by dissolving, emulsifying or dispersing ingredients to constitute a light-sensitive layer into proper solvents, coating the compositions on a support, and drying the coat(s).

In general, each of the above-described coating compositions is prepared by firstly preparing each of liquid compositions containing individual ingredients, and then mixing these liquid compositions. These liquid compositions may be prepared for each ingredient, or so as to contain two or more of ingredients together. Some of the ingredients to constitute the light-sensitive layer can be added during or after the preparation of the foregoing liquid composition or coating composition. Further, as described hereinafter, a method of preparing a secondary composition by emulsifying an oily (or aqueous) composition containing one or more of an ingredient into an aqueous (or oily) solvent can be employed.

A polymerizable compound in the photopolymerizable composition of the present invention can be incorporated in a light-sensitive layer in the form of emulsion droplets, and the droplets can be enclosed with microcapsule wall. Therein, it is to be desired that the salt formed by the organic boron compound anion and the organic cationic dye compound also should be contained in the droplets.

To the composition of the present invention, a thermal polymerization inhibitor can be further added mainly for the purpose of inhibiting the thermal polymerization of the photopolymerizable composition during storage. Specific examples of the thermal polymerization inhibitor include p-methoxyphenol, hydroquinone, alkyl- or aryl-substituted hydroquinones, t-butylcatechol, pyrogallol, cuprous chloride, chloranil, naphthylamine, $\beta$-naphthol, 2,6-di-t-butyl-p-cresol, pyridine, nitrobenzene, dinitrobenzene, p-toluidine, methylene blue organocopper, methyl salicylate, and so on. These thermal polymerization inhibitors each are preferably used in an amount of from 0.001 to 5 parts by weight per 100 parts by weight of ethylenic unsaturated compound.

As a polymerization accelerator which can be further added to the composition of the present invention, a reducing agent, e.g., an oxygen scavenger or a compound that functions as a chain transfer agent of an active hydrogen donor, can be used in combination with a compound containing an —SH group in the molecule. Specific examples of oxygen scavengers which have been found to be useful include phosphines, phosphonates, phosphites, stannous salts, and other compounds which can be easily oxidized with oxygen. Useful examples of chain transfer agents include N-phenylglycine, trimethyl barbituric acid, 2-mercaptobenzoxazole, 2-mercaptobenzothiazole, N,N-dimethyl-2,6-diisopropylaniline, N,N-2,4,6-pentamethylaniline, and other compounds having hydrogen that can be easily extracted with a radical.

A color image-forming substance can be incorporated into the composition of the present invention, and thereby the polymerized part can be colored after removal of the unpolymerized part, or a color image can be formed in an image-receiving element into which the unpolymerized part is transferred A wide variety of color image-forming substances can be used in the present invention. For instance, dyes and pigments can be cited as materials which are colored in themselves. When these materials are used, the part (the microcapsules) in which high molecular weight polymers have not been produced is destroyed, and the materials are transferred into an image-receiving material using an appropriate means to result in the formation of color images. As for the dyes and pigments, not only commercially available ones but also other known dyes and pigments, e.g., as described in various literature [such as *Senryo Binran* (which means "handbook of dyes"), compiled by Yukigosei Kagaku Kyokai and published in 1970, and *Seishin Ganryo Binran* (which means "the newest handbook of pigments"), compiled by Nippon Ganryo Gijutsu Kyokai and published in 1977], can be utilized. These dyes and pigments are used in the form of a solution or a dispersion.

On the other hand, color image-forming colorless substances are divided into two groups. One group consists of substances which, although themselves are colorless or only lightly colored, develop their colors by the application of some energy, e.g., heat, pressure, light and so on. The other group consists of substances which, although themselves do not develop their colors by the application of any energy, develop their colors by contact with another component. As examples of substances belonging to the former group, there are known thermochromic compounds, piezochromic compounds, photochromic compound, and leuco bodies such as triarylmethane dyes, quinone dyes, indigoide dyes, azine dyes and so on. Each of these compounds develops its color by the application of heat or pressure, irradiation with light, or air oxidation.

Examples of the latter group include various kinds of systems comprising two or more components among which such a reaction as an acid-base reaction, a reduction-oxidation reaction, a coupling reaction or a chelate-forming reaction takes place to produce a color. More specifically, there can be utilized a color-producing system as is used for pressure-sensitive paper, which comprises a color former having such a partial structure as a lactone, lactam, spiropyran or the like, and an acidic substance (a color developer) such as acid clay, phenols or the like; a system utilizing the azo coupling reaction between an aromatic diazonium salt, diazotate or diazosulfonate, and naphthols, anilines, active methylenes or the like; and chelate-forming systems utilizing the reaction of hexamethylenetetraamine with ferric ion and gallic acid, the reaction between phenolphthalein-Complexon and an alkaline earth metal ion, and so on; redox reactions such as the reaction between ferric stearate and pyrogallol, the reaction of silver behenate and 4-methoxy-1-naphthol, and so on.

As examples of another system in which color can be developed by a reaction between two components, cases in which heating is required for bringing about the reaction are known. In these cases, it is necessary to heat the system simultaneously with or just after the twocomponent mixing caused by rupture of microcapsules upon application of pressure.

As examples of a color former in the color former/color developer system, mention may be made of (1) triarylmethane compounds, (2) diphenylmethane compounds, (3) xanthene compounds, (4) thiazine compounds and (5) spiropyran compounds. Specific examples of these compounds include those described in U.S. Pat. No. 4,283,458 and so on. Among these compounds, color formers of (1) triarylmethane type and (3) xanthene type are favored over others, because most of these can provide low density of fog and high density of developed color. Specific examples of color formers of such types include Crystal Violet lactone, 3-diethylamino-6-chloro-7-($\beta$-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, and so on. These compounds may be used alone or as a mixture of two or more.

As for the color developer, phenolic compounds, organic acids or metal salts thereof, oxybenzoic acid esters, acid clay and so on can be employed.

Specific examples of phenol compounds include 4,4'-iso-propylidene-diphenol (bisphenol A), p-tertbutylphenol, 2,4-dinitrophenol, 3,4-dichlorophenol, 4,4'-methylene-bis(2,6-di-tert-butylphenol), p-phenylphenol, 1,1-bis(4-hydroxyphenyl)-cyclohexane, 1,1-bis(4-hydroxyphenyl)-2-ethylhexane, 2,2-bis(4-hydroxyphenyl)butane, 2,2'-methylenebis(4-tert-butylphenol), 2,2'-methylenebis($\alpha$-phenyl-p-cresol)thiodiphenol, 4,4'-thiobis(6-tertbutyl-m-cresol), sulfonyldiphenol, p-tertbutylphenol/formaldehyde condensate, p-phenylphenol/formaldehyde condensate, and the like.

Useful examples of organic acids and their metal salts include phthalic acid, phthalic anhydride, maleic acid, benzoic acid, gallic acid, o-toluic acid, p-toluic acid, salicylic acid, 3-tert-butylsalicylic acid, 3,5-ditert-butyl-salicyclic acid, 5-$\alpha$-methylbenzylsali-cylic acid, 3,5-($\alpha$-methylbenzyl)salicylic acid, 3-tert-octylsalicylic acid, and zinc, lead, aluminium, magnesium and nickel salts of these acids. In particular, salicylic acid derivatives, and zinc and aluminium salts thereof are superior to other in color developability, fastness of the developed color images, storability of the recording sheets using them, and so on.

Specific examples of oxybenzoic acid esters include ethyl p-oxybenzoate, butyl p-oxybenzoate, heptyl p-oxybenzoate, benzyl p-oxybenzoate, and the like.

On the other hand, diffusion and fixation of components enclosed in microcapsules can be designed by combined use with an oil-absorbing white pigment.

In order to fuse such a color developer as described above at an intended temperature to thereby to make the color development proceed, it is desirable that the color developer should be added as an eutectic mixture with a heat-fusible substance having a low melting point, or in such a condition that a low melting compound is fused on the individual surfaces of the color developer particles and stuck thereto.

Specific examples of low melting compounds include higher fatty acid amides such as stearic acid amide, erucic acid amide, palmitic acid amide , ethylenebis-stearoamide, etc., waxes such as higher fatty acid esters, etc., phenyl benzoate derivatives, aromatic ether derivatives, and urea derivatives. However, low melting compounds other than the above-cited ones can also be used in the present invention.

As for the color formers to be used in another color former/color developer system, phenolphthalein, fluorescein, 2',4',5',7'-tetrabromo-3,4,5,6-tetrachlorofluorescein, Tetrabromophenol Blue, 4,5,6,7-tetrabromophenolphthalein, Eosine, Aurin Cresol Red, 2-naphtholphenolphthalein and so on can be mentioned.

Color developers suitable for the combined use with the above-cited color formers are nitrogen-containing compounds, such as inorganic and organic ammonium salts, organic amines, amides, urea and thiourea and their derivatives, thiazoles, pyrroles, pyrimidines, piperazines, guanidines, indoles, imidazoles, imidazolines, triazoles, morpholines, piperidines, amidines, formazines, pyridines, and the like. Specific examples of these compounds include ammonium acetate, tricyclohexylamine, tribenzylamine, octadecylbenzylamine, stearylamine, allylurea, thiourea methylthiourea, allylthiourea, ethylenethiourea, 2-benzylimidazole, 4-phenylimidazole, 2-phenyl-4-methyl-imidazole, 2-undecylimidazoline, 2,4,5-trifuryl-2-imidazoline, 1,2- diphenyl4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N'-dibenzylpiperazine, 4,4'-dithiomorpholine, morpholinium trichloroacetate, 2-amino-benzothiazole, and 2-benzoylhydrazino-benzothiazole.

The color image-forming substance can be used in the present invention, in an amount of from about 0.5 to about 20 parts by weight, particularly preferably from about 2 to about 7 parts by weight, per 100 parts by weight of the polymerizable compound. The color developer is used in an amount of from about 0.3 to about 80 parts by weight per 1 parts by weight of the color former.

In microencapsulating the photopolymerizable composition of the present invention, methods well-known to those skilled in the art can be employed. For instance, methods of utilizing the coacervation of hydrophilic wall-forming materials, as described in U.S. Pat. Nos. 2,800,457 and 2,800,458; interfacial polymerization methods as described in U.S. Pat. No. 3,287,154, British Patent 990,443, JP-B-38-19574, JP-B-42-446, and JP-B-42-771; methods of utilizing the deposition of polymers as described in U.S. Pat. Nos. 3,418,250 and 3,660,304; methods of using isocyanatepolyol wall materials as described in U.S. Pat. No. 3,796,669; methods using isocyanate wall materials a described in U.S. Pat. No. 3,914,511; methods of using the wall materials of urea-formaldehyde type or urea-formaldehyde-resorcinol type as described in U.S. Pat. Nos. 4,001,140, 4,087,376 and 4,089,802; methods of using wall forming materials such as melamine-formaldehyde resin, hydroxypropyl cellulose and the like as described in U.S. Pat. No. 4,025,455; the in situ method for polymerization of monomers as described in JP-B-36-9168 and U.S. Pat. No. 4,001,140; the electrolytic dispersing and cooling method as described in British Patents 952,807 and 965,074; and spray drying methods as described in U.S. Pat. No. 3,111,407 and British Patent 930,422 can be cited. Although the microencapsulation methods to be used in the present invention should not be construed as being limited to the above-cited ones, it is desirable that a polymer film as a microcapsule wall should be formed after the emulsification of a core material.

In particular, when a microcapsule wall is formed by a microencapsulation method which involves the polymerization of reactants supplied from the inside of individual oil dkroplets, great effects can be achieved. That is, capsules suitable for a recording material in respect that they have a uniform size and excellent freshness or storage stability can be obtained in a short time.

For instance, in the case of using polyurethane as a microcapsule wall material, the microcapsule wall is formed in the following manner: A polyisocyante and a second substance to react therewith (e.g., polyol, polyamine) are mixed with an oily liquid to be microencapsulated, the resulting mixture is emulsified and dispersed in water, and then the temperature of the resulting dispersion is raised to bring about the polymer forming reaction at the individual oil droplet surfaces. Therein, an auxiliary solvent having a low boiling point and strong dissolving power can be used in the oily liquid.

Polyisocyanates and their fellow reactants, e.g., polyols or polyamines, as disclosed in U.S. Pat. Nos. 3,281,383, 3,723,363, 3,773,695, 3,793,268, and 3,838,108, JP-B-48-40347, and JP-A-48-84086 can also be used in the above-described capsule wall formation.

Specific examples of polyisocyanates include diisocyanates such as m-phenylenediisocyanate, p-phenylenediisocyanate, 2,6-tolylenediisocyanate, 2,4-tolylenediisocyanate, naphthalene-1,4-diisocyanate, diphenylmethane-4,4'-diisocyanate, 3,3'-dimethoxy-4,4'-biphenyl-diisocyanate, 3,3'-dimethyldiphenylmethane-4,4'diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate, cyclohexylene-1,4-diisocyanate and the like; triisocyanates such as 4,4',4''-triphenyl methanetriisocyanate, toluene-2,4,6-triisocyanate and the like; tetraisocyanates such as 4,4'-dimethyldiphenylmethane-2,2',5,5'-tetraisocyanate; and isocyanate prepolymers such as an adduct of hexamethylenediisocyanate and trimethylolpropane, an adduct of 2,4-tolylenediisocyanate and trimethylolpropane, an adduct of xylylenediisocyanate and trimethylolpropane, an adduct of tolylenediisocyanate and hexanetriol, and so on.

As examples of polyols, mention may be made of aliphatic and aromatic polyhydric alcohols, hydroxypolyesters, hydroxypolyalkylene ethers, and so on.

In addition, polyols as described in U.S. Pat. No. 4,650,740 can also be used. Specifically, they include ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, an adduct of pentaerythritol and ethylene oxide, an adduct of glycerin and ethylene oxide, glycerin, 1,4-di(2-hydroxyethoxy)benzene, condensation products of aromatic polyhydric alcohols and alkylene oxides (e.g., resorcinol dihydroxyethyl ether), p-xylylene glycol. m-xylylene glycol, α,α'-dihydroxy-p-diisopropylbenzene, 4,4'-dihydroxy-diphenylmethane, 2-(p,p'-dihydroxydiphenylmethyl)benzyl alcohol, an adduct of bisphenol A and ethylene oxide, an adduct of bisphenol A and propylene oxide, and so on. Such a polyol as described above is preferably used in an amount of from about 0.02 to about 2 moles, based on hydroxyl group, per 1 mole of isocyanate group.

Suitable examples of polyamines include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetertramine, diethylaminopropylamine, tetraethylenepentamine, adducts of amines and epoxy compounds, and so on.

Polyisocyanates can also form high molecular weight compounds by reaction with water.

In forming microcapsules, water-soluble macromolecules can be used. They may by any of watersoluble anionic, nonionic and amphoteric macromolecules. As for the anionic macromolecules, both natural and synthetic ones, e.g., those having -COO$\ominus$, -SO$_3\ominus$, etc., can be used. Specific examples of anionic natural macromolecules include gum arabic, alginic acid, pectin, etc., and those of semi-synthetics include carboxymethyl cellulose, phthaloylated gelatin, sulfated starch, sulfated cellulose, lignin sulfonic acid, etc. As examples of synthetics of anionic macromolecules, mention may be made of maleic anhydride type copolymers (including hydrolysis products), acrylic acid type homo- and copolymers (including those of methacrylic acid type), vinylbenzenesulfonic acid type homo- and co-polymers, carboxy-denatured polyvinyl alcohol, and so on.

As examples of nonionic macromolecules, mention may be made of polyvinyl alcohol. hydroxyethyl cellulose, methyl cellulose, and so on.

As for the amphoteric macromolecules, gelatin and the like can be used.

These water-soluble macromolecules are used in the form of an about 0.01 to about 10 wt % water solution. The size of the microcapsules is controlled to about 20 microns or less.

The size of capsules used in the present invention is about 80 microns or less, and sizes of about 20 microns or less are preferred from the standpoints of ensuring storage stability and treatment facility. On the other hand, when capsules are too small in size, it is feared that they are lost in holes or fibers of the substrate. Therefore, capsule sizes, although they cannot absolutely be stated because of dependence on the properties of the substrate or support used, are preferably about 0.1 micron or above.

It is to be desired that capsules to be used in the present invention should cause, in a substantial sense, no change under a pressure of about 10 Kg/cm$^2$ or less, and undergo rupture only when pressure greater than the foregoing value is imposed thereon. The magnitude of the pressure under which the rupture occurs can be changed depending on the intended use, so it should not be limited to particular values. However, it is preferred to rupture the capsules under a pressure of about 500 Kg/cm$^2$ or less. Such a pressure characteristic can be controlled by properly choosing the capsule size, the thickness of capsule wall, and the kinds of wall materials.

In encapsulating the polymerizable compounds and color image-forming substances to be used in the present invention, solvents can be used together. Also, solvents can be used when reducing agents, color developers and so on are introduced into a desired element. For instance, a solution prepared by dissolving ingredients as described above in water or a hydrophilic organic solvent, optionally together with a binder, is coated directly on a support, or introduced into a desired element according to known methods, e.g., the method disclosed in U.S. Pat. No. 2,322,027. Incorporation of a solvent in individual microcapsules enables control of the degree of rupture of the microcapsules and amount of the color image-forming substance transferred from the inside of capsule into an image-receiving element when pressure is applied. A suitable amount of a solvent used inside the microcapsules is from about 1 to about 500 parts by weight per 100 parts by weight of the polymerizable compounds.

Solvents usable in the microcapsules of the present invention are both natural and synthetic oils. specific examples of such solvents include cotton seed oil, kerosene, aliphatic ketones, aliphatic esters, paraffin, naphthene oil, alkylated biphenyl, alkylated terphenyl, chlorinated paraffin, alkylated naphthalene, diarylethanes (such as 1-phenyl-1-xylylethane, 1-phenyl-1-p-ethylphenylethane, 1,1'-ditolylethane, etc.), phthalic acid alkyl esters (e.g., dibutyl phthalate, dioctyl phthalate), phosphoric acid esters (e.g., diphenyl phosphate, triphenyl phosphate, tricresyl phosphate, dioctylbutyl phosphate), citric acid esters (e.g., tributyl acetylcitrate), benzoic acid esters (e.g., octyl benzoate), alkylamides (e.g., diethyllaurylamide), fatty acid esters (e.g., dibutoxyethyl succinate, dioctyl acetate), trimesic acid esters (e.g., tributyl trimesate), lower alkyl acetates (such as ethyl acetate, butyl acetate, etc.), ethyl propionate, secondary butyl alcohol, methyl isobutyl ketone, $\beta$-ethoxyethylacetate, methyl cellosolve acetate, cyclohexanone, and so on.

An image-receiving element to be used together with the light-sensitive element comprising the composition of the present invention is an element for color development or fixation of the color image-forming substance released from the light-sensitive microcapsules. The light-sensitive microcapsules and the image-receiving element may by present in the same layer or separate layers provided on the same support, or in separate layers provided on different supports such as the combination of a light-sensitive sheet having the light-sensitive microcapsule-containing layer on a support with an image-receiving sheet having the image-receiving layer on another support.

In addition, the image-receiving element of the present invention may contain a mordant such as an anionic polymer or a cationic polymer, if needed. Therein, the anionic polymer and the cationic polymer may be used in combination In the light-sensitive and the image-receiving materials of the present invention, binders can be used alone or in combination. Representatives of hydrophilic binders are transparent or translucent ones, with specific examples including natural substances such as proteins, e.g., gelatin, gelatin derivatives, cellulose derivatives, etc., and polysaccharides, e.g., starch, gum arabic, etc.; and synthetic polymers such as water-soluble polyvinyl compounds, e.g., polyvinyl pyrrolidone, acrylamide polymers, etc. As examples of another synthetic polymer, there can be cited vinyl polymers dispersed in the latex form.

Also, addition vinyl polymers soluble in organic solvents can be used as a binder.

Supports which can be used for the light-sensitive material and the image-receiving material in the present invention are those which can withstand the processing pressure or the processing temperature. As for the general supports, not only glass, paper, wood free paper, coat paper, art paper, synthetic paper, metals and their analogues, but also an acetyl cellulose film, a cellulose ester film, a polyvinyl acetal film, a polystyrene film, a polycarbonate film, a polyethylene terephthalate film, and related films and resinous materials can be employed. In addition, paper supports laminated with polymers such as polyethylene and the like can be used. Also, polyester films described in U.S. Pat. Nos. 3,634,089 and 3,725,070 can be preferably used.

The light-sensitive material of the present invention can be provided with auxiliary layers such as a protective layer, an antistatic layer, an anticurl layer, a peel-apart layer, a matting layer, etc., if desired. In the protective layer, it is particularly desirable to incorporate an organic or inorganic matting agent for the purpose of prevention of adhesion.

Further, the light-sensitive material and the image-receiving material may contain an antifoggant, a brightening agent, a discoloration inhibitor, dyes and pigments for prevention of halation and irradiation (including white pigments such as titanium oxide), dyes for toning or coloring the materials, a thermal polymerization inhibitor, a surface active agent, a dispersed vinyl compound and so on, if needed.

Various exposure means can be employed in the present invention. In general, usually employed light sources, such as sunlight, Strobe, flash, a tungsten lamp, a mercury lamp, a halogen lamp like a iodine lamp, a xenon lamp, laser beams, a CRT light source, a plasma light source, a fluorescent tube, a light emitting diode and so on can be cited as examples. In addition, such exposure means as to combine a microshutter array with a linear or plate-form light source utilizing LCD (liquid crystal device), PLZT (lanthanum-doped lead titanozirconate), or so on can be employed.

For the purpose of enhancing the sensitivity, the layer containing the light-sensitive microcapsules of the present invention can be heated before, during and/or after the exposure.

In the present invention, images can also be developed in the exposed element by washing off the unexposed soluble part with a solvent, or thermally transferring the unexposed unhardened part into the image-receiving material, or other known methods. In the method of washing off with a solvent, not only organic solvents but also alkaline aqueous solutions can be used as a developing solvent. Examples of suitable developing solutions include a solution of an alkali carbonate such as sodium carbonate; a solution of an alkali hydroxide such as sodium hydroxide; a mixture thereof; an aqueous solution containing a lower alcohol, such as ethanol, isopropanol, etc., and an alkanolamine such as ethanolamine, propanolamine, 2-diethylaminoethanol, etc.; and their analogues.

The presence of s surface active agent in the developing solution can further clear development of the elements. An alkali strength of the developing solution depends on the characteristics of the composition used. Also, the developing solution can contain dyes, pigments, and so on. The developed images are rinsed with distilled water, and dried. After drying, the exposed images may further be exposed, if desired.

The present invention will now be described by reference to the following specific example which is not meant to be limiting. Unless otherwise specified, all percents, ratios, etc., are by weight.

EXAMPLE 1

The following photopolymerizable compositions B-1 and B-2 were prepared using the photopolymerization initiator solutions A-1 and A-2, respectively, shown in Table 1 below.

| | |
|---|---|
| Pentaerythritol tetraacrylate | 1.0 g |
| Benzyl methacrylate/methacrylic acid (73/27 by mole) copolymer | 0.8 g |
| Acetone | 5 g |
| Methyl ethyl ketone | 10 g |
| propylene glycol monomethyl ether acetate | 5 g |
| Photopolymerization initiator solution (shown in Table 1) | See Table 1 |

TABLE 1

| Initiator Solution Composition | A-1 | A-2 |
|---|---|---|
| Acetone | 5 g | 5 g |

TABLE 1-continued

| | | |
|---|---|---|
| Photopolymerization initiator (a)* | 0.09 g | — |
| Photopolymerization initiator (b)** | — | 0.09 g |
| Additive (a)*** | 0.06 g | 0.06 g |

*Photopolymerization initiator (a)

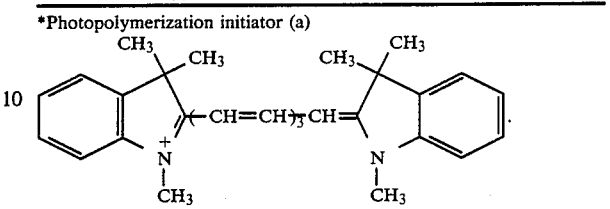

**Photopolymerization initiator (b)

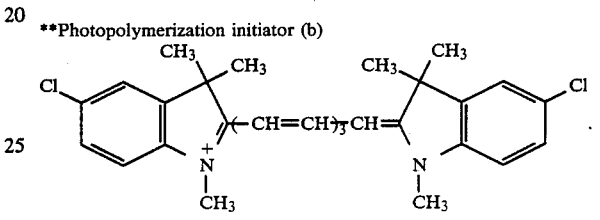

***Additive (a) (Automatic oxidizing agent)

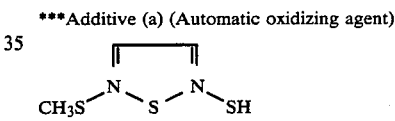

Each of the obtained photopolymerizable compositions B-1 and B-2 was applied on a 100-μm polyethylene terephthalate film in a thickness of 2 μm, dried at a temperature of 100° C. for 2 minutes, further coated with the following overcoating layer in a thickness of 1 μm, and dried at a temperature of 100° C. for 2 minutes to obtain each of the photosensitive sheets 1 and 2.

| Coating solution for overcoating layer | |
|---|---|
| Water | 98 g |
| Polyvinyl alcohol | 1.7 g |
| Hydroxypropyl methyl cellulose | 1.7 g |
| Polyvinyl pyrrolidone | 8.7 g |

The photosensitive sheets 1 and 2 were exposed to the light of a xenon lamp (made by Ushio Electric Inc.) through a step wedge (density step difference of 0.15 density step number of 0–15 steps, Fuji Step Guide P made by Fuji Photo Film CO., Ltd.) using a vacuum printing frame device. After exposure, development was carried out with the following developing solution.

| Developing solution | |
|---|---|
| Anhydrous sodium carbonate | 10 g |
| Butyl cellosolve | 5 g |
| Water | 1 liter |

The exposed areas corresponding to the high steps (low exposure) of step wedges were eluted with the developing solution, and thereby the surface of the polyethylene terephthalate came to appear, indicating that sufficient polymerization had not occurred. The highest step number at which it was not possible to elute an exposed area was adopted as the step number of each sensitive material. Thus, a higher step number means that the sensitive material polymerizes at a lower level of exposure and has a correspondingly higher sensitivity.

The result is shown in Table 2.

TABLE 2

| Photosensitive sheet (relation to the present invention) | Initiator solution used | Number of steps |
|---|---|---|
| 1 (Comparison) | A-1 | run out |
| 2 (Invention) | A-2 | 3 steps |

As clearly shown in Table 2, the employment of a compound having an electron-attracting group (chlorine) in the indolenine nucleus according to the present invention brings about the effect of improving the sensitivity as compared to a nucleus having no electron-attracting group.

The photosensitive sheet 1 of the Comparative Example had no hardening of the photosensitive layer, which caused the images to flow, and so the number of steps could not be determined.

EXAMPLE 2

To each of the photopolymerization initiator solutions C-1 and C-2 shown in Table 3 consisting of the indicated organic cationic dyes, organic boron anionic salts and other additives was added 3.3 g of polyisocyanate (SUMIDUR N-75, made by Sumitomo Chemical Co., Ltd.). To each of the resulting solution s was added a solution prepared by dissolving 12 g of a color former, Perscript Red 1-6-B (made by Ciba Geigy Co., Ltd.) in 50 g of trimethylol propane triacrylate to obtain mixtures. Each of these mixtures was added to an aqueous solution prepared by dissolving 4.3 g of sodium polystyrene sulfonate (made by National Starch Co., Ltd., VERSA TL50²) in 154 g of water, then adding 5.1 g of pectin thereto and adjusting the pH thereof to 6.0 to obtain an emulsified dispersion. To each of the resulting dispersions was added a reaction solution consisting of 44 g water, 3.9 g of melamine and 6.5 g of 37% formalin which were previously reacted at 60° C. for 30 minutes, and after mixing, the pH was adjusted to 6.0. Then, the mixture was heated to 65° C. and reacted with stirring for 3 hours. To the reaction solution was added 7.7 g of urea. Then, the pH of the solution was adjusted to 9.5 with NaOH solution to obtain each of microcapsule solutions D-1 and D-2 having a microcapsule size of 3.5 μm.

TABLE 3

| | Solution | |
| Composition | C-1 | C-2 |
|---|---|---|
| Dichloromethane | 2 g | 2 g |
| Photopolymerization initiator (a) | 0.2 g | — |
| Photopolymerization initiator (b) | — | 0.2 g |
| Additive (b)**** | 0.35 g | 0.35 g |

The photopolymerization initiators (a) and (b) are the same as used in Table 1.

****Additive (b)

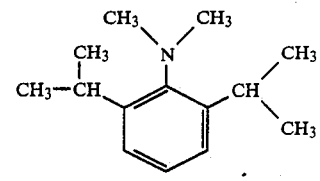

Production of Photosensitive Sheet and Image-receiving Sheet.

To 5 g each of the thus obtained capsule solutions D-1 and D-2 was added 1.53 g of 15% polyvinyl alcohol aqueous solution, 3.47 g distilled water, and 0.57 g of starch to obtain each coating solution. Each solution was applied onto art paper with Coating Rod 10, and dried at 50° C. for 15 minutes to obtain each of photosensitive sheets 3 and 4.

On the other hand, to 21.8 g of water were added 0.6 g of 48% SBR latex, 4 g of 10% etherified starch aqueous solution, 2.1 g of zinc carbonate, 1.3 g 50% sodium silicate aqueous solution, 0.1 g of sodium hexamethaphosphate, and 13 g of acid clay, and the mixture was stirred for 15 minutes with a homogenizer.

The thus obtained solution was applied onto sheets of art paper with Coating Rod 18 and dried at 100° C. for 2 minutes to obtain image-receiving sheets.

Reproduction of Images and Result.

The reproduction of images was carried out as follows:

The light of a xenon lamp (made by Ushio Electric Inc.) was irradiated to said photosensitive sheets through the line original and through a step wedge having a density difference of √2 (Fuji Step Guide P, made by Fuji Photo Film CO., Ltd.). After completion of exposure, the exposed photosensitive sheet was placed on an imagereceiving sheet so that the coated surfaces of both sheets faced each other. Then the two sheets were passed through a pressure roller having linear pressure of 100 kg/cm. The capsules in the non-exposed part were broken and transferred to the image-receiving sheet. The transferred part gave a clear image having a density of 1.0. Although the part of the image-receiving sheet corresponding to the exposed part of the photosensitive material changes the density thereof according to the amount of exposure, the minimum exposure step number having a density of 0.1 or less was defined as the sensitivity (which corresponds to the toe sensitivity). Namely, the larger exposure step number corresponds to a lower exposure and thus shows a higher sensitivity. The results are shown in Table 4.

TABLE 4

| Photosensitive sheet (relation to the present invention) | Photopolymerization initiator solution | Step Number |
|---|---|---|
| 3 (Comparison) | C-1 | 6 steps |
| 4 (Invention) | C-2 | 9 steps |

As clearly shown in Table 4, the employment of the compound having an electron-attracting group (i.e., chlorine atom) in the indolenine nucleus of the present invention showed the higher sensitivity as compared to the compound having no electron-attracting group.

EXAMPLE 3

The following photopolymerizable compositions E-1, E-2 and E-3 were prepared in the same manner as described for the photopoymerizable composition B-1 of Example 1 except that the following photopolymerization initiators (c), (d) and (e) were used instead of the photopolymerization initiator (b), respectively.

Photopolymerization initiator (c)

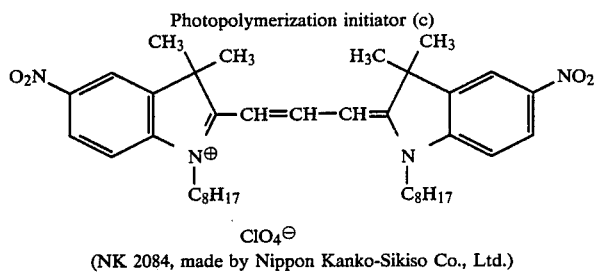

ClO$_4^\ominus$ (NK 2084, made by Nippon Kanko-Sikiso Co., Ltd.)

Photopolymerization initiator (d)

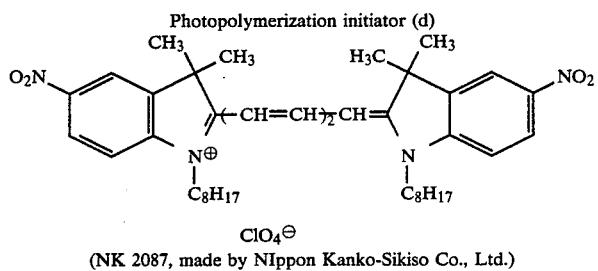

ClO$_4^\ominus$ (NK 2087, made by NIppon Kanko-Sikiso Co., Ltd.)

Photopolymerization initiator (e)

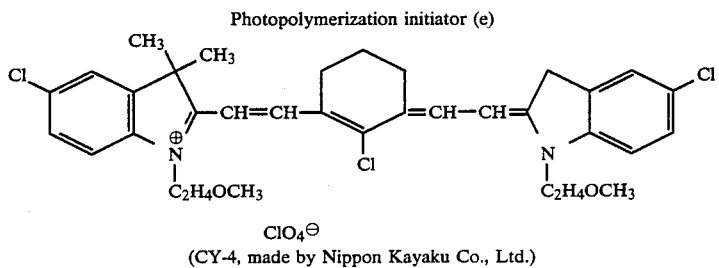

ClO$_4^\ominus$ (CY-4, made by Nippon Kayaku Co., Ltd.)

Each of the obtained photopolymerizable compositions E-1, E-2 and E-3 was applied to the same measurement as of Example 1. As a result, it was confirmed that all the photosensitive sheets prepared from the photopolymerizable compositions E-1, E-2 and E-3 showed the higher sensitivity as compared to the comparative photosensitive sheet 1 of Example 1.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition which comprises (a) a polymerizable compound having at least one ethylenic unsaturated bond, and (b) a salt formed by an organic cationic dye compound and an organic boron compound anion, wherein the salt is represented by the following formula (I), with the organic cationic dye compound (D$^\oplus$) being represented by the following fomrula (II):

wherein D$^\oplus$ represents a cationic dye represented by formula (II), R$^1$, R$^2$, R$^3$, and R$^4$, which may be the same or different, each represents an alkyl group, an aryl group, an aralkyl group, an alkaryl group, an alkenyl group, an alkinyl group, an alicyclic group, a heterocyclic group, an allyl group, and a derivative thereof, and two or more of R$^1$, R$^2$, R$^3$, and R$^4$ may combine with each other to form a cyclic structure;

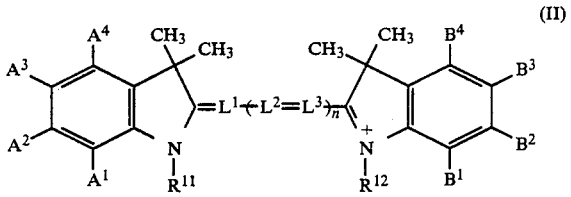

wherein R$^{11}$ and R$^{12}$ each represents an alkyl group, L$^1$, L$^2$, and L$^3$ each represents a methine group, n represents an integer of 0 to 4, and A$^1$, A$^2$, A$^3$, A$^4$, B$^1$, B$^2$, B$^3$ and B$^4$, which may be the same or different, each represents a hydrogen atom or an electron-attracting group, with the proviso that at least one of the A$^1$, A$^2$, A$^3$, A$^4$, B$^1$, B$^2$, B$^3$ and B$^4$ represents an electron-attracting group.

2. A photopolymerizable composition as in claim 1, wherein said polymerizable compound having at least one ethylenic unsaturated bond is encapsulated into microcapsules.

3. A photopolymerizable composition as in claim 2, wherein said microcapsules containing said polymerizable compound having at least one ethylenic unsaturated bond further contain said salt formed by an organic cationic dye compound and an organic boron compound anion.

4. A photopolymerizable composition as in claim 1, wherein $R^{11}$ and $R^{12}$ in the formula (II) are selected from the group consisting of unsubstituted alkyl groups, aralkyl groups, hydroxyalkyl groups, carboxyalkyl groups, alkoxyalkyl groups, sulfoalkyl groups, sulfatoalkyl groups, heterocyclic substituted alkyl groups, a 2-acetoxyethyl group, a carbomethoxymethyl group, a 2-methane sulfonylaminoethyl group and an allyl group.

5. A photopolymerizable composition as in claim 1, wherein one or more of $L^1$, $L^2$ and $L^3$ are substituted with a substituent selected from the group consisting of an alkyl group, an aryl group, an aralkyl group, a halogen atom and an alkoxy group provided that two or more of said substituents may combine with each other to form a 4–6 membered ring.

6. A photopolymerizable composition as in claim 1, wherein said electron-attracting group is selected from the group consisting of a halogen atom, a nitro group, a carbamoyl group, an alkoxycarbonyl group, a sulfamoyl group and a cyano group.

7. A photopolymerizable composition as in claim 6, wherein said electron-attracting group is selected from the group consisting of fluorine, chlorine, bromine and iodine atoms and carbamoyl, N-ethylcarbamoyl, N-propylcarbamoyl, N-hexylcarbamoyl, methoxycarbonyl, ethoxycarbonyl, 2-ethylhecyloxycarbonyl, octyloxycarbonyl, sulfamoyl, N-butylsulfamoyl and cyano groups.

8. A photopolymerizable composition as in claim 7, wherein said electgron-attracting group is chlorine atom.

9. A photopolymerizable composition as in claim 1, wherein said salt formed by an organic boron compound anion and an organic cationic dye compound is present in an amount of from 0.01 to 50 wt % based on the weight of said polymerizable compound.

* * * * *